United States Patent
Shao et al.

(10) Patent No.: US 12,376,289 B2
(45) Date of Patent: Jul. 29, 2025

(54) SEMICONDUCTOR STRUCTURE AND METHOD FOR FABRICATING SAME

(71) Applicant: CHANGXIN MEMORY TECHNOLOGIES, INC., Hefei (CN)

(72) Inventors: Guangsu Shao, Hefei (CN); Deyuan Xiao, Hefei (CN); Yunsong Qiu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 578 days.

(21) Appl. No.: 17/952,263

(22) Filed: Sep. 25, 2022

(65) Prior Publication Data

US 2023/0120017 A1  Apr. 20, 2023

(30) Foreign Application Priority Data

Jul. 5, 2022 (CN) .......................... 202210785352.7

(51) Int. Cl.
*H10B 12/00* (2023.01)
*H01L 21/768* (2006.01)
*H01L 23/522* (2006.01)
*H01L 23/528* (2006.01)

(52) U.S. Cl.
CPC ..... *H10B 12/488* (2023.02); *H01L 21/76898* (2013.01); *H01L 23/5222* (2013.01); *H01L 23/5283* (2013.01); *H10B 12/02* (2023.02); *H10B 12/482* (2023.02)

(58) Field of Classification Search
CPC .... H10B 12/488; H10B 12/02; H10B 12/482; H10B 12/053; H10B 12/34; H10B 12/30; H01L 21/76898; H01L 23/5222; H01L 23/5283; H01L 21/76801; H01L 23/5386
See application file for complete search history.

(56) References Cited

U.S. PATENT DOCUMENTS 7,566,620 B2    7/2009  Abbott
2024/0292606 A1*  8/2024  Hua ..................... H10B 12/053

* cited by examiner

*Primary Examiner* — Mohammed R Alam
(74) *Attorney, Agent, or Firm* — Kilpatrick Townsend & Stockton LLP

(57) ABSTRACT

Embodiments provide a semiconductor structure and a method for fabricating the same, and relate to the field of semiconductor technology. The method includes: providing a substrate provided with word line trenches and bit line trenches, where the word line trenches and the bit line trenches separate the substrate into active pillars arranged at intervals, and along a first direction, a dielectric layer is provided between adjacent active pillars; forming initial protective layers on side walls of the word line trenches; forming word line isolation structures in the region surrounded by the initial protective layers, the word line isolation structures having gaps therein; forming sealing members configured to seal up at least tops of the gaps; forming first filling regions; and forming word lines extending along the first direction in the first filling regions. Parasitic capacitance is prevented in the semiconductor structure, and performance of the semiconductor structure is improved.

15 Claims, 9 Drawing Sheets

US 12,376,289 B2

SEMICONDUCTOR STRUCTURE AND METHOD FOR FABRICATING SAME

CROSS-REFERENCE TO RELATED APPLICATION

This application claims priority to Chinese Patent Application No. 202210785352.7, titled "SEMICONDUCTOR STRUCTURE AND METHOD FOR FABRICATING SAME" and filed to the State Patent Intellectual Property Office on Jul. 5, 2022, the entire contents of which are incorporated herein by reference.

TECHNICAL FIELD

Embodiments of the present disclosure relate to the field of semiconductor technology, and more particularly, to a semiconductor structure and a method for fabricating the same.

BACKGROUND

As a semiconductor memory that randomly writes and reads data at a high speed, a dynamic random access memory (DRAM) and is widely used in data storage devices or apparatuses. The DRAM includes a plurality of memory cells arranged repeatedly, each of the memory cells includes a transistor and a capacitor, and the capacitor is connected to a source or a drain of the transistor by means of a capacitor contact structure. With development of semiconductor technologies, a size of a semiconductor structure is getting smaller and smaller, and a parasitic capacitance is easily generated, resulting in poorer performance of the semiconductor structure.

SUMMARY

In view of the above problems, embodiments of the present disclosure provide a semiconductor structure and a method for fabricating the same.

A first aspect of the embodiments of the present disclosure provides a method for fabricating a semiconductor structure, and the method includes: providing a substrate, word line trenches extending along a first direction and bit line trenches extending along a second direction being provided in the substrate, the word line trenches and the bit line trenches separating the substrate into a plurality of active pillars arranged at intervals, and along the first direction, a dielectric layer being provided between adjacent two of the plurality of active pillars; wherein the first direction intersects with the second direction; forming initial protective layers on side walls of the word line trenches, the substrate being exposed in a region surrounded by the initial protective layers; forming word line isolation structures in the region surrounded by the initial protective layers, the word line isolation structures having gaps; forming sealing members configured to seal up at least tops of the gaps; forming first filling regions, the first filling regions being exposed on outer peripheral surfaces of the plurality of active pillars and outer peripheral surfaces of the word line isolation structures; and forming word lines extending along the first direction in the first filling regions, the word lines being connected to all of the plurality of active pillars positioned in the same first direction.

A second aspect of the embodiments of the present disclosure provides a semiconductor structure, which is fabricated by means of the method for fabricating the semiconductor structure according to the first aspect.

BRIEF DESCRIPTION OF THE DRAWINGS

To describe the technical solutions of the embodiments of the present disclosure or those of the prior art more clearly, the accompanying drawings required for describing the embodiments or the prior art will be briefly introduced below. Apparently, the accompanying drawings in the following description are merely some embodiments of the present disclosure. To those of ordinary skills in the art, other accompanying drawings may also be derived from these accompanying drawings without creative efforts.

DETAILED DESCRIPTION

As described in the background, the transistors of the semiconductor structure in the related technologies are prone to generate the coupling capacitance. Based on research, it is found that a reason for this problem is that when forming word lines, word line trenches are generally formed first in the substrate, dielectric layers and word line isolation structures arranged in a stack are then formed in the word line trenches, and the word line isolation structures fill up a region surrounded by the dielectric layers. However, when forming the word line isolation structures, it is easy to form gaps in the word line isolation structures. Therefore, when the dielectric layers are subsequently removed to form, between active pillars and the word line isolation structures, filling regions to be filled with the word lines, the gaps of the word line isolation structures may be enlarged, and further, when conductive materials are deposited in the filling regions, the conductive materials may be filled into the gaps, resulting in formation of a parasitic capacitance between this part of the conductive materials and the word lines, such that performance of the semiconductor structure is reduced.

In view of the above technical problem, embodiments of the present disclosure provide a semiconductor structure and a method for fabricating the same. By forming the sealing members, and sealing up the gaps by means of the sealing members, to prevent the gaps from being enlarged when the initial protective layers are removed. In this way, it is avoidable that the conductive materials are filled into the gaps subsequently, thereby preventing formation of the parasitic capacitance between the conductive materials filled into the gaps and the word lines, such that the performance of the semiconductor structure can be improved.

To make the above objectives, features, and advantages of the embodiments of the present disclosure more apparent and lucid, the technical solutions in the embodiments of the present disclosure will be described clearly and completely below with reference to the accompanying drawings in the embodiments of the present disclosure. Apparently, the described embodiments are merely some but not all of the embodiments of the present disclosure. All other embodiments obtained by persons of ordinary skill in the art based on the embodiments of the present disclosure without creative efforts shall fall within the protection scope of the present disclosure.

This embodiment does not impose restrictions on the semiconductor structure, and an introduction will be made below by taking an example where the semiconductor structure is a dynamic random access memory (DRAM), but this embodiment is not limited thereto, and the semiconductor structure in this embodiment may also be other structures.

Figure 1:
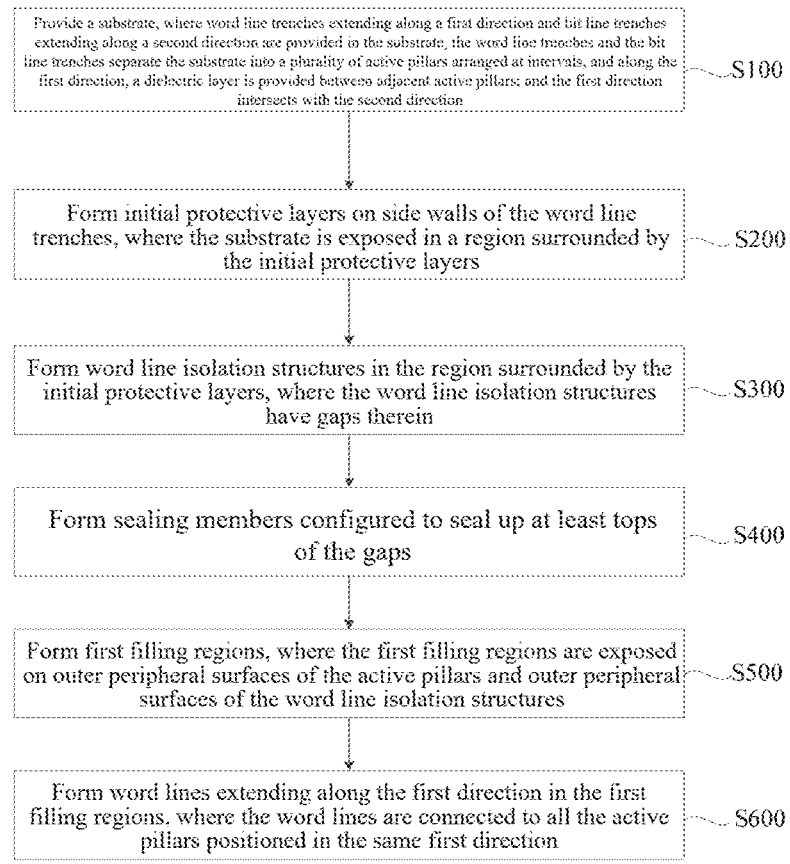
FIG. 1 is a process flow diagram of a method for fabricating a semiconductor structure according to an embodiment of the present disclosure.

Referring to FIG. 1, the method for fabricating the semiconductor structure provided by the embodiments of the present disclosure includes following steps.

Step S100: providing a substrate, where word line trenches extending along a first direction and bit line trenches extending along a second direction are provided in the substrate, the word line trenches and the bit line trenches separate the substrate into a plurality of active pillars arranged at intervals, and along the first direction, a dielectric layer is provided between adjacent active pillars; and the first direction intersects with the second direction. A structure of the substrate may be referred to FIG. 2 and FIG. 3.

For example, a substrate 10 is configured to support semiconductor devices therein or thereon, and the substrate 10 may be a silicon (Si) substrate, a germanium (Ge) substrate, a silicon germanium (GeSi) substrate, a silicon carbide (SiC) substrate, a Silicon on Insulator (SOI) substrate or a Germanium on Insulator (GOI) substrate, etc.

Forming the bit line trenches and the word line trenches in the substrate 10 may be performed according to the following process steps. For example, a plurality of bit line trenches are formed in the substrate 10, where the plurality of bit line trenches are spaced along the first direction, and each of the bit line trenches extends along the second direction. For example, the bit line trenches are spaced along the first direction X, and each of the bit line trenches extends along the second direction Y.

The plurality of bit line trenches are spaced along the first direction X, such that the plurality of bit line trenches divide the substrate 10 into a plurality of strip-shaped bodies spaced along the first direction X.

After the bit line trenches are formed, an initial dielectric layer is formed in each of the bit line trenches by means of a deposition process. The initial dielectric layer fills up the bit line trenches, and also extends out of the bit line trenches and covers a top surface of the substrate 10. That is, the initial dielectric layer also covers top surfaces of the strip-shaped bodies.

The deposition process may include any one of chemical vapor deposition (CVD), physical vapor deposition (PCD), or atomic layer deposition (ALD), etc.

The initial dielectric layers are configured to achieve insulation between the adjacent strip-shaped bodies. Material of the initial dielectric layers includes silicon oxide, but is not limited thereto.

After forming the initial dielectric layers, a plurality of word line trenches are formed in the initial dielectric layers and the substrate 10. The plurality of word line trenches are arranged at intervals along the second direction, and each of the word line trenches extends along the first direction. The retained part of the initial dielectric layers constitute dielectric layers 32. Depths of the word line trenches are less than depths of the bit line trenches.

Depth directions of the word line trenches are perpendicular to the substrate 10. The plurality of word line trenches divide the strip-shaped bodies into a plurality of active pillars 40 arranged at intervals.

The retained part of the initial dielectric layers form the dielectric layers 32, and the dielectric layers 32 are configured to achieve the insulation between the adjacent active pillars 40 along the first direction.

The depths of the word line trenches are less than the depths of the bit line trenches, such that when the bottoms of all the active pillars 40 positioned in the same second direction are connected together, the bit lines are subsequently formed in the region where the bottoms of the active pillars 40 positioned in the same second direction are connected together (referring to FIG. 3).

In this embodiment, by connecting the bottoms of all the active pillars 40 positioned in the same second direction together, the bit lines may be connected to the active pillars 40 positioned in the same second direction simultaneously, such that the plurality of active pillars 40 positioned in the same second direction have the same voltage, thereby ensuring stability of a threshold voltage of the semiconductor structure, and reducing a floating body effect of the semiconductor structure.

Step S200: forming initial protective layers on side walls of the word line trenches, where the substrate is exposed in a region surrounded by the initial protective layers.

Figure 2:
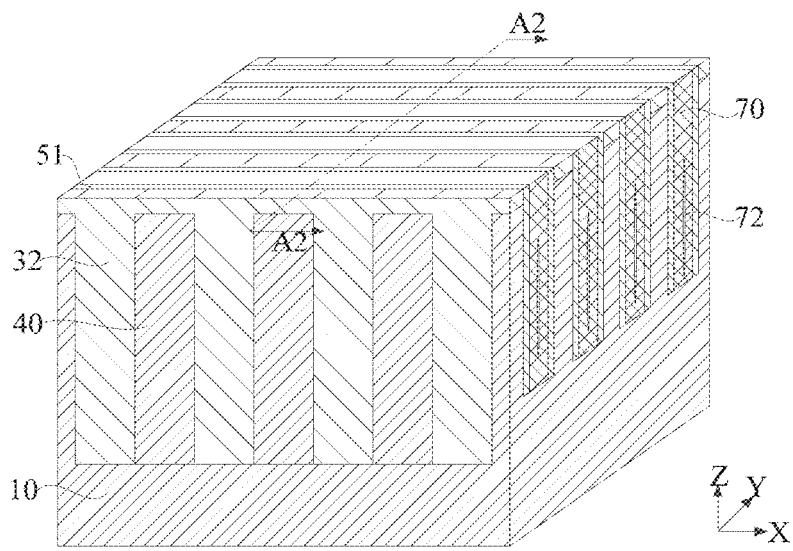
FIG. 2 is a schematic diagram of forming a word line isolation structure according to the method for fabricating the semiconductor structure provided in an embodiment of the present disclosure.
Figure 3:
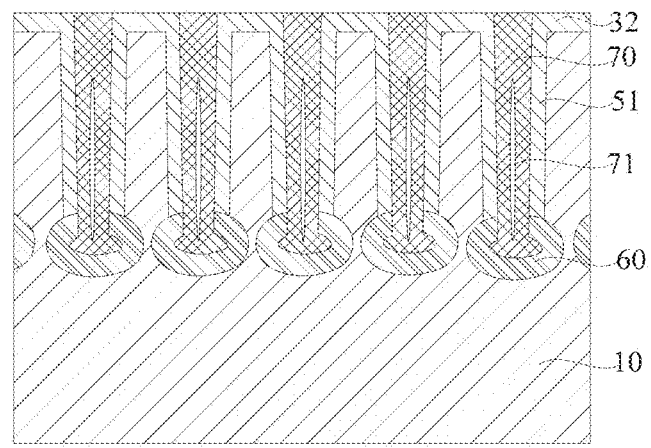
FIG. 3 is a sectional view along an A2-A2 direction in FIG. 2.

For example, referring to FIG. 2 and FIG. 3, insulating materials are deposited on inner walls of the word line trenches by means of an atomic layer deposition process. Next, the insulating materials positioned on bottom walls of the word line trenches are removed, and the insulating materials retained on the side walls of the word line trenches constitute initial protective layers 51. Materials of the initial protective layers 51 include silicon oxide, but are not limited thereto.

The initial protective layers 51 are configured to protect the side walls of the active pillars 40 in the second direction, to prevent causing damage to the active pillars 40 during subsequent formation of the bit lines, thereby improving the performance of the semiconductor structure.

The substrate 10 is exposed in a region surrounded by the initial protective layers 51 to facilitate subsequent processing of the substrate 10, such as hole expanding or plasma processing.

For example, referring to FIG. 3, the substrate exposed in the word line trenches is siliconized to form bit lines 60 extending along the second direction, and the bit lines 60 are connected to the bottoms of the active pillars 40.

In this embodiment, there are a plurality of bit lines 60, the plurality of bit lines 60 are arranged at intervals along the first direction, and each of the bit lines 60 extends along the second direction. Each of the bit lines 60 is configured to connect all the active pillars 40 positioned in the same second direction, to ensure the plurality of active pillars 40 positioned in the same second direction to have the same voltage, thereby ensuring the stability of the threshold voltage of the semiconductor structure, and reducing the floating body effect of the semiconductor structure.

It should be noted that, before the step of forming the initial protective layers, ion doping may be performed on the active pillars 40, such that a first doped region and a second doped region are formed in each of the active pillars 40. For example, along a direction perpendicular to the substrate 10, each of the active pillars 40 includes a channel region and a first doped region and a second doped region positioned on two sides of the channel region, where the first doped region and the second doped region have the same type of doped ions, e.g., P-type ions or N-type ions. The type of the doped ions in the channel region is different from the type of the doped ions in the first doped region.

In an example, when the doped ions in the first doped region are the N-type ions, correspondingly, the doped ions in the channel region are the P-type ions. In another example, when the doped ions in the first doped region are the P-type ions, correspondingly, the doped ions in the channel region are the N-type ions.

In this case, the bit line 60 may be connected to any one of the first doped region and the second doped region. For example, when the first doped region is positioned below the channel region, the bit line 60 is connected to the first doped region. For another example, when the second doped region is positioned below the channel region, the bit line 60 is connected to the second doped region.

Step S300: forming word line isolation structures in the region surrounded by the initial protective layers, the word line isolation structures having gaps therein.

Still referring to FIG. 2 and FIG. 3, for example, the insulating materials are deposited in the region surrounded by the initial protective layers by means of the deposition process, and the insulating materials further cover the top surfaces of the dielectric layers 32 and the top surfaces of the active pillars 40. Next, the insulating materials positioned on the top surfaces of the dielectric layers and the top surfaces of the active pillars may be removed by means of chemical mechanical polishing (CMP), such that the top surfaces of the insulating materials are flush with the top surfaces of the dielectric layers 32, and the retained part of the insulating materials constitute the word line isolation structures 70. Materials of the word line isolation structures 70 include silicon nitride, but are not limited thereto.

The dielectric layers 32 and the word line isolation structures 70 on the top surfaces of the active pillars 40 may also be removed by means of the CMP process, such that the top surfaces of the word line isolation structures 70 are flush with the substrate 10 to planarize the top surface of the substrate 10, thereby facilitating the subsequent fabrication of sealing layers 81.

It should be noted that, affected by the deposition process and depth-to-width ratio of the word line trenches, the word line isolation structures 70 formed have gaps 71.

Step S400: forming sealing members configured to seal up at least tops of the gaps.

It should be noted that, the sealing members may be constituted by part of the word line isolation structures 70, or may be constituted by other redeposited components.

Referring to FIG. 3 to FIG. 20, in an example, each of the sealing members 80 includes a plurality of sealing strips, and each of the plurality of sealing strips is projected on the substrate 10 to cover all the active pillars 40 positioned in the same second direction, or to cover at least the word line isolation structures 70.

Referring to FIG. 21 to FIG. 26, in another example, part of the word line isolation structures 70 are removed, and the gaps 71 are not exposed on the top surfaces of the retained part of the word line isolation structures 70, such that the sealing members 80 are formed in the regions between the top surfaces of the retained part of the word line isolation structures 70 and the tops of the gaps 71.

Step S500: forming first filling regions, the first filling regions being exposed on outer peripheral surfaces of the active pillars and outer peripheral surfaces of the word line isolation structures.

Step S600: forming word lines extending along the first direction in the first filling regions, the word lines being connected to all the active pillars positioned in the same first direction.

In this embodiment, by forming the sealing members, and sealing up the gaps by means of the sealing members to prevent the gaps from being enlarged when the initial protective layers are removed. In this way, it is avoidable that the conductive materials are filled into the gaps subsequently, thereby preventing formation of the parasitic capacitance between the conductive materials filled into the gaps and the word lines, such that the performance of the semiconductor structure can be improved.

Figure 4:
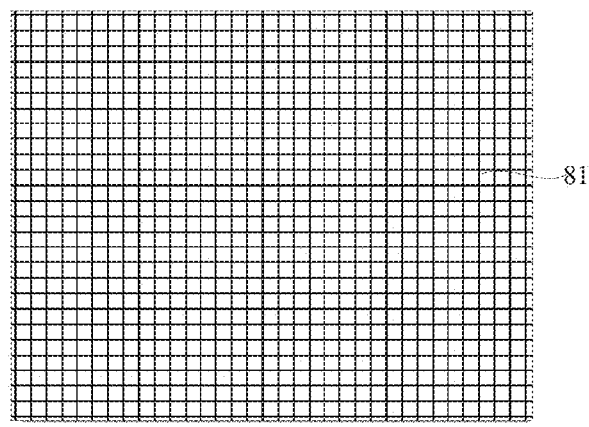
FIG. 4 is a schematic diagram of forming a sealing layer according to the method for fabricating the semiconductor structure provided in an embodiment of the present disclosure.

In a possible implementation, referring to FIG. 4, the sealing layers 81 are formed on the substrate 10, and the sealing layers 81 further cover the initial protective layers 51 and the word line isolation structures 70. The sealing layers 81 may be fabricated by means of a deposition process.

Figure 5:
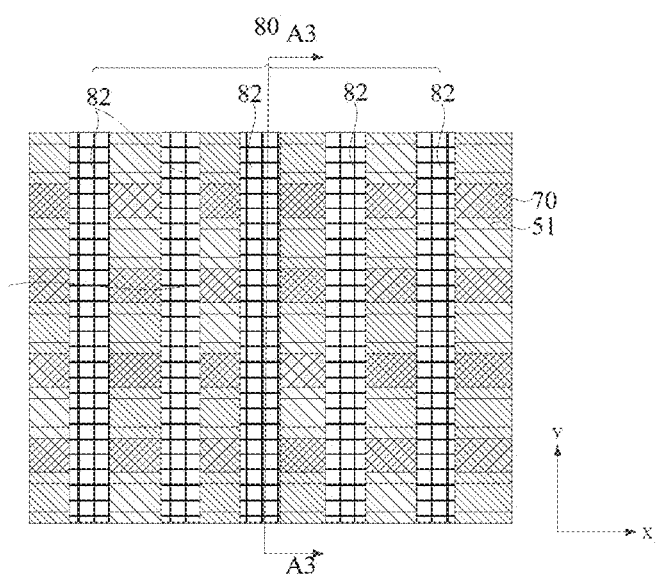
FIG. 5 is a schematic diagram I of forming a sealing member according to the method for fabricating the semiconductor structure provided in an embodiment of the present disclosure.
Figure 6:
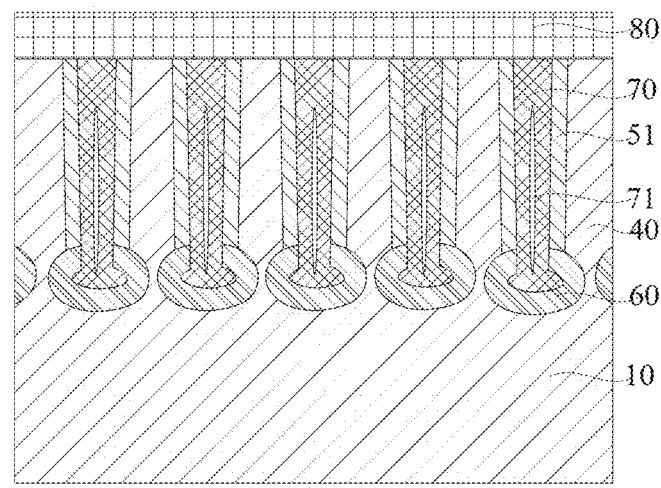
FIG. 6 is a sectional view along an A3-A3 direction in FIG. 5.

Referring to FIG. 5 and FIG. 6, the sealing layers 81 are patterned, part of the sealing layers 81 are removed, and a retained part of the sealing layers 81 form a plurality of first sealing strips 82 spaced along the first direction. Each of the plurality of first sealing strips 82 extends along the second direction, and a projection of each of the plurality of first sealing strips 82 on the substrate 10 covers all the active pillars 40 positioned in the same second direction, where the plurality of first sealing strips 82 constitute the sealing members 80. The sealing members 80 can seal up the tops of the gaps 71.

Figure 7:
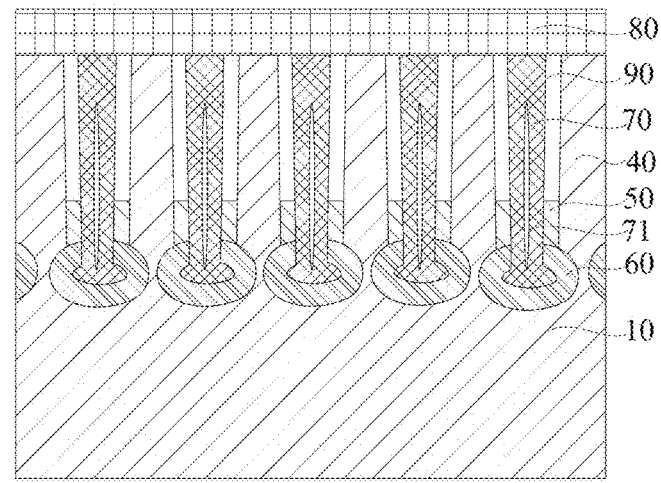
FIG. 7 is a schematic diagram I of forming a first filling region according to the method for fabricating the semiconductor structure provided in an embodiment of the present disclosure.
Figure 8:
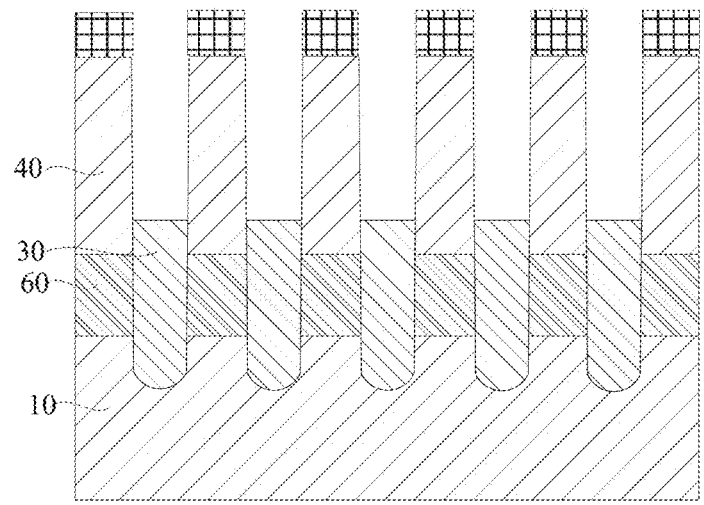
FIG. 8 is a schematic diagram of forming a bit line isolation structure according to the method for fabricating the semiconductor structure provided in an embodiment of the present disclosure.

Referring to FIG. 7 and FIG. 8, the step of forming the first filling regions includes: removing part of the initial protective layers 51 and part of the dielectric layers 32 to form the first filling regions 90 where part of the outer peripheral surfaces of the active pillar 40 and part of the outer peripheral surfaces of the initial bit line isolation structures 71 are exposed, where the retained part of the dielectric layers 32 constitute the bit line isolation structures 30. The retained part of the initial protective layers constitute the protective layers 50.

Figure 9:
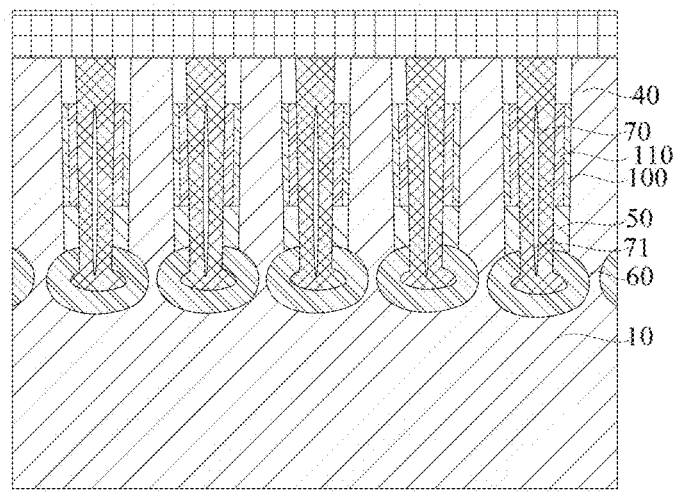
FIG. 9 is a schematic diagram I of forming a word line according to the method for fabricating the semiconductor structure provided in an embodiment of the present disclosure.
Figure 10:
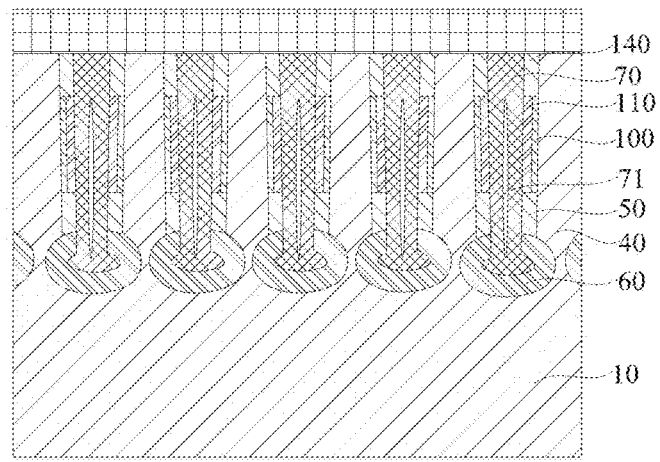
FIG. 10 is a schematic diagram I of forming an insulating layer according to the method for fabricating the semiconductor structure provided in an embodiment of the present disclosure.

Referring to FIG. 9, gate oxide layers 100 are formed by means of the deposition process, and the gate oxide layers 100 wrap the outer peripheral surfaces of the active pillars 40 exposed in the first filling regions 90. That is, the gate oxide layers 100 wrap the channel regions of the active pillars 40.

Next, still referring to FIG. 9, word lines 110 wrapping the gate oxide layers 100 are formed. The word lines 110 extend along the first direction and are configured to connect all the active pillars 40 in the same first direction.

In this embodiment, by forming the sealing members capable of sealing up part of the gaps, exposure of the gaps may be avoided. Furthermore, the conductive materials configured to form the word lines 110 may be deposited into the first filling regions 90 from the side surfaces of the active pillars 40, instead of entering the first filling regions 90 from the top surfaces of the active pillars 40. Therefore, it is difficult for the conductive materials configured to form the word lines 110 to be filled into the gaps 71, and thus the parasitic capacitance of the semiconductor structure is not increased, such that the performance of the semiconductor structure is improved.

In a possible embodiment, the step of forming the sealing members configured to seal up at least the tops of the gaps includes following steps.

Figure 11:
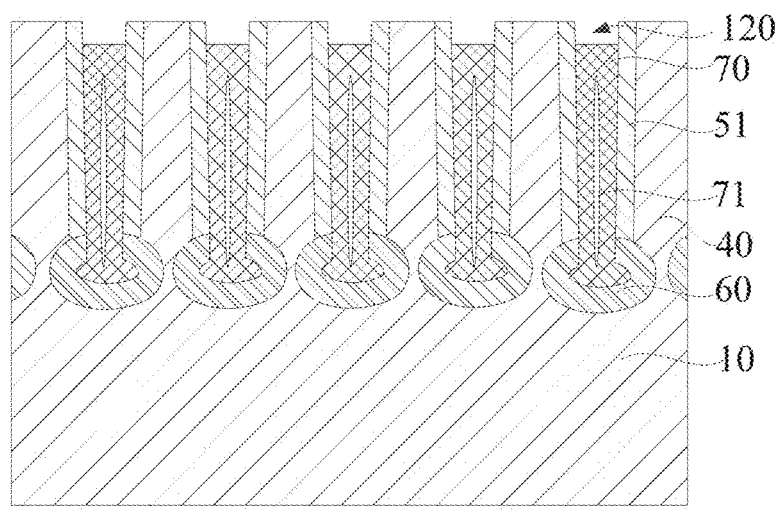
FIG. 11 is a schematic diagram of forming a second filling region according to the method for fabricating the semiconductor structure provided in an embodiment of the present disclosure.

Referring to FIG. 11, the word line isolation structures 70 are removed by part of a thickness, a retained part of the word line isolation structures 70 and the initial protective layers define second filling regions 120, and the gaps 71 are not exposed in the second filling regions 120.

That is, the word line isolation structures 70 positioned above the substrate 10 and part of the word line isolation structures 70 positioned in the word line trenches are removed, and the retained part of the word line isolation structures 70 and the initial protective layers define the second filling regions 120

It should be noted that the dielectric layers 32 may further cover the top surfaces of the active pillars 40. When removing the word line isolation structures 70 by part of the thickness, the dielectric layers 32 positioned on the top surfaces of the active pillars 40 may also be removed. In this case, it is necessary to adjust a ratio of an etching solution or an etching gas, and the etching time, such that the etching rate of the etching gas or the etching solution to the dielectric layers 32 and the initial protective layers 51 is small. More word line isolation structures 70 may be etched at this moment, such that the top surfaces of the word line isolation structures 70 are lower than the initial protective layers 51 and define the second filling regions 120 with the initial protective layers 51.

Figure 12:
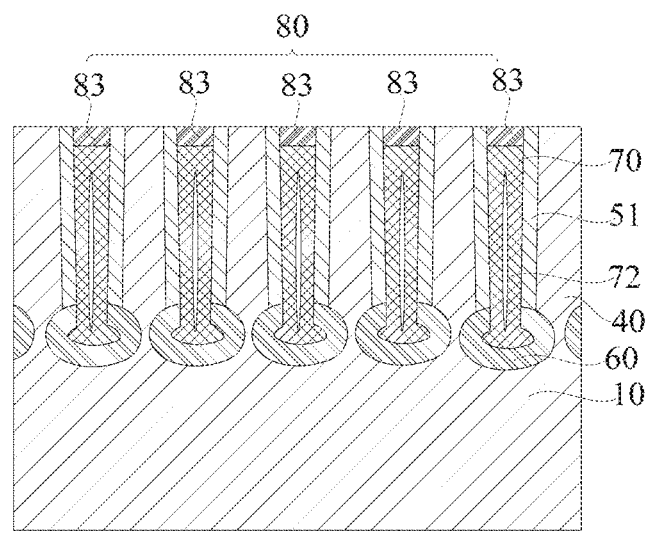
FIG. 12 is a schematic diagram II of forming a sealing member according to the method for fabricating the semiconductor structure provided in an embodiment of the present disclosure.

Next, referring to FIG. 12, a plurality of second sealing strips 83 are formed in the second filling regions 120 by means of the deposition process. The plurality of second sealing strips 83 are arranged at intervals along the second direction, and each of the second sealing strips 83 extends along the first direction.

The second sealing strips 83 are projected on the substrate 10 to cover the word line isolation structures 70. That is, the projections of the second sealing strips 83 on the substrate 10 cover the word line isolation structures 70. The plurality of second sealing strips 83 constitute the sealing members 80. Materials of the second sealing strips 83 include silicon nitride, but are not limited thereto.

Figure 13:
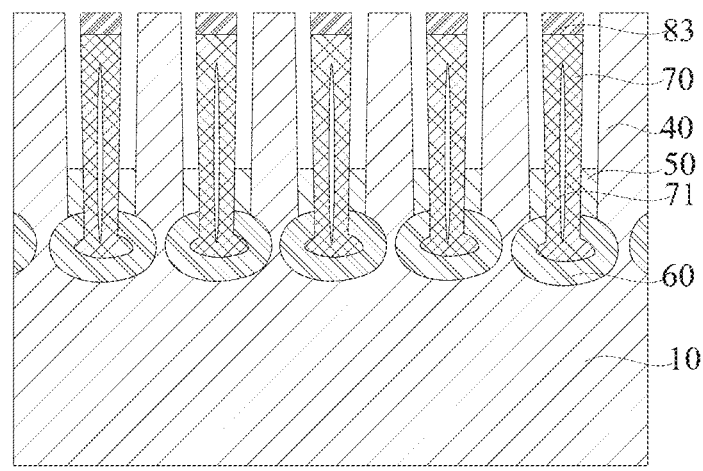
FIG. 13 is a schematic diagram II of forming the first filling region according to the method for fabricating the semiconductor structure provided in an embodiment of the present disclosure.

Referring to FIG. 13, the step of forming the first filling regions 90 includes: removing part of the initial protective layers 51 and part of the dielectric layers 32 to form the first filling regions 90 where part of the outer peripheral surfaces of the active pillar 40 and part of the outer peripheral surfaces of the word line isolation structure 70 are exposed, where the retained part of the dielectric layers 32 constitutes the bit line isolation structures 30, and the retained part of the initial protective layers 51 constitute the protective layers 50.

Figure 14:
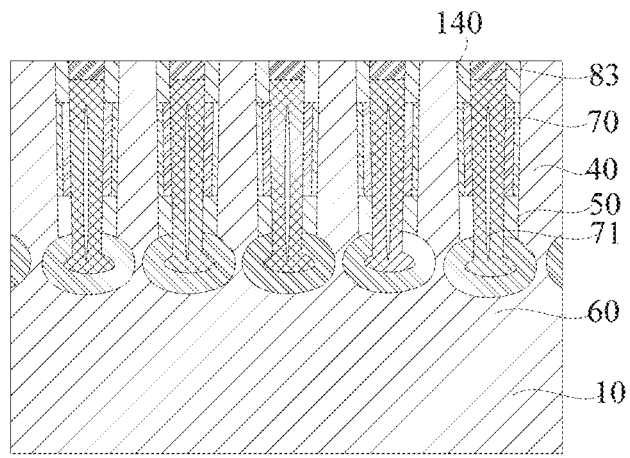
FIG. 14 is a schematic diagram II of forming a word line according to the method for fabricating the semiconductor structure provided in an embodiment of the present disclosure.

Referring to FIG. 14, the step of forming the word lines extending along the first direction in the first filling regions 90 includes: forming the gate oxide layers 100 by means of the deposition process, the gate oxide layers 100 wrapping the outer peripheral surfaces of the active pillars 40 exposed in the first filling regions 90. That is, the gate oxide layers 100 wrap the channel regions of the active pillars 40.

Next, the word lines 110 wrapping the gate oxide layers 100 are formed. The word lines 110 extend along the first direction and are configured to connect all the active pillars 40 in the same first direction.

In this embodiment, the second sealing strips 83 are provided on the top surfaces of the retained part of the word line isolation structures 70, and the second sealing strips 83 may prevent the gaps 71 from being exposed to the air. In this way, during subsequent removal of the initial protective layers 51, because expansion of the gaps 71 can be avoided, the conductive materials for subsequent formation of the word lines are prevented from filling the gaps 71, thereby avoiding the parasitic capacitance, and improving the performance of the semiconductor structure.

In a possible embodiment, the step of forming the sealing members configured to seal up at least the tops of the gaps includes following steps.

Figure 15:
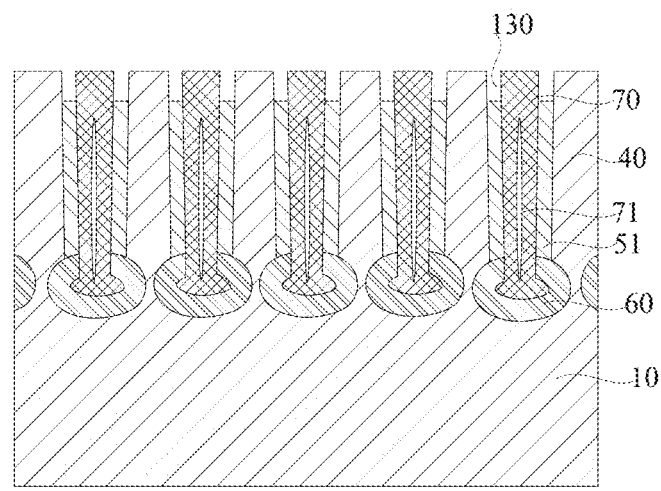
FIG. 15 is a schematic diagram of forming an etching hole according to the method for fabricating the semiconductor structure provided in an embodiment of the present disclosure.

Referring to FIG. 15, the initial protective layers 51 are removed by part of the thickness by means of a first etching process to form etching holes 130 extending along the first direction. That is, the etching holes 130 are surrounded by the retained part of the initial protective layers 51, the word line isolation structures 70, the active pillars 40, and the dielectric layers.

The etching selectivity of the first etching process to the initial protective layers 51 and the word line isolation structures 70 is greater than 2. That is, an etching amount of the first etching process to the word line isolation structures 70 is smaller, and the etching amount of the first etching process to the initial protective layers 51 is larger, such that the etching holes 130 are formed between the retained part of the initial protective layers and the word line isolation structures.

In this embodiment, the initial protective layers 51 are etched by 30 nm to 40 nm within the etching time of 2 s to 5 s by means of the first etching process, such that the top surfaces of the retained part of the initial protective layers are lower than the top surfaces of the active pillars 40, and the top surfaces of the word line isolation structures 70 are flush with the top surfaces of the active pillars 40.

It should be noted that the process of removing the initial protective layers 51 by part of the thickness may be completed by means of a one-step etching process, or may be completed by means of a two-step etching process. For example, the initial protective layers are removed by a first thickness within first subetching time by means of the first etching process. Next, the initial protective layers are removed by a second thickness within second subetching time by means of the first etching process. Sum of the first subetching time and the second subetching time is between 2 s and 5 s. Sum of the first thickness and the second thickness is between 30 nm and 40 nm.

When the initial protective layers 51 are removed by part of the thickness by means of the two-step etching process, the thickness of the initial protective layers 51 to be removed may be precisely controlled, thereby improving the accuracy of the etching process.

Figure 16:
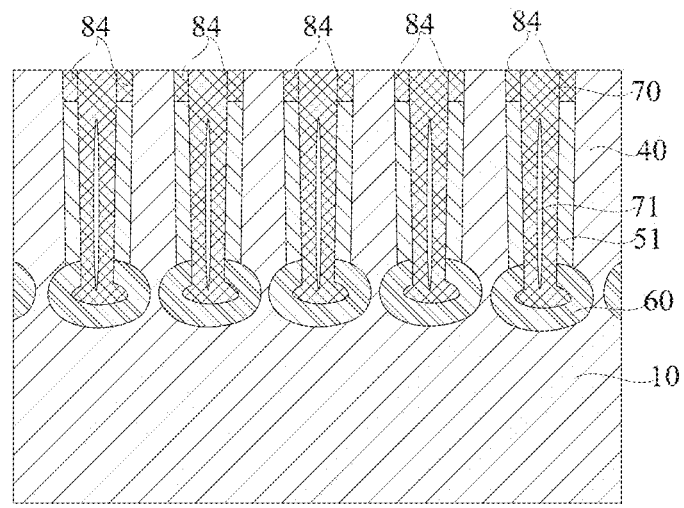
FIG. 16 is a schematic diagram III of forming a sealing member according to the method for fabricating the semiconductor structure provided in an embodiment of the present disclosure.
Figure 17:
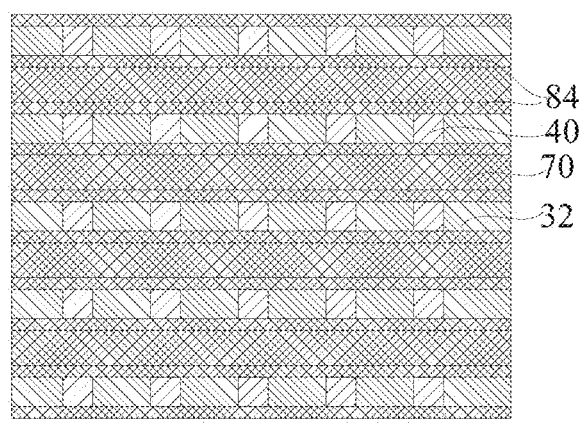
FIG. 17 is a vertical view of FIG. 16.

Referring to FIG. 16 and FIG. 17, third sealing strips 84 are formed in the etching holes 130 by means of the deposition process. The tops of the word line isolation structures 70 and the third sealing strips 84 positioned on two sides of the word line isolation structures 70 constitute one sealing member 80. Materials of the third sealing strips 84 are the same as those of the word line isolation structures 70, including silicon nitride, but not limited thereto.

Figure 18:
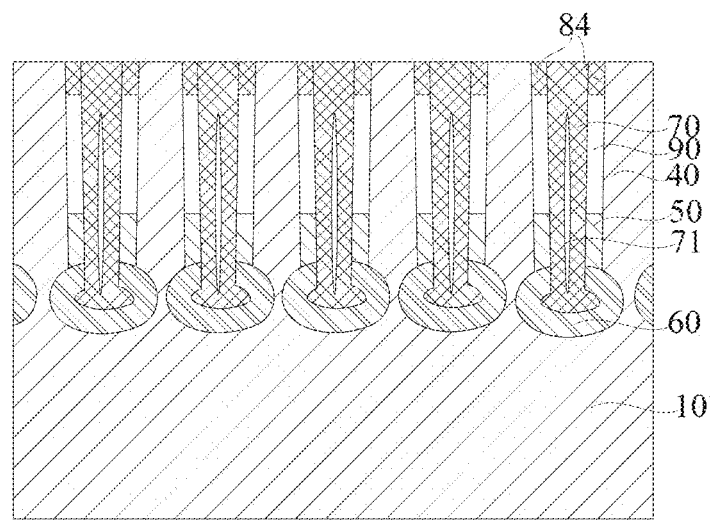
FIG. 18 is a schematic diagram III of forming the first filling region according to the method for fabricating the semiconductor structure provided in an embodiment of the present disclosure.
Figure 19:
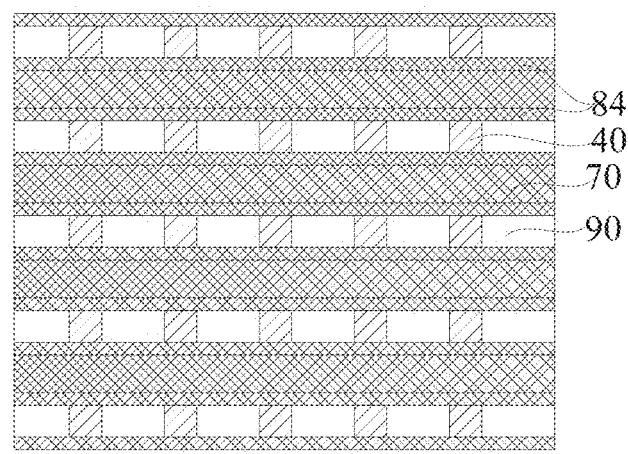
FIG. 19 is a vertical view of FIG. 18.
Figure 20:
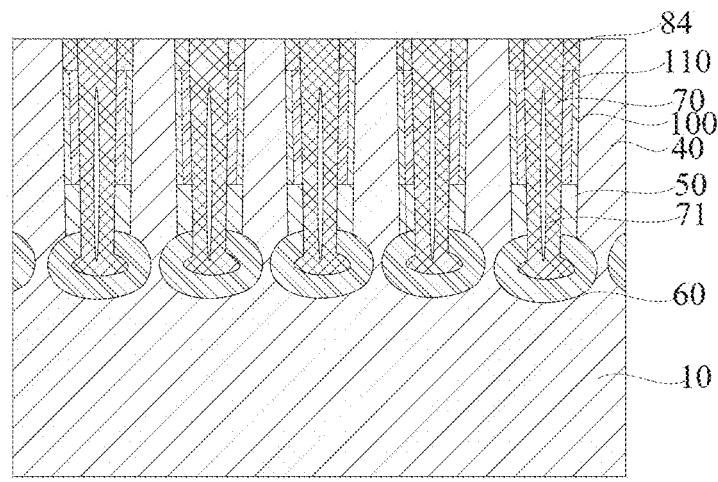
FIG. 20 is a schematic diagram III of forming the word line according to the method for fabricating the semiconductor structure provided in an embodiment of the present disclosure.

After the sealing members 80 are formed, the first filling region needs to be formed. Referring to FIG. 18 and FIG. 19, this step includes: removing part of the initial protective layers 51 and part of the dielectric layers 32 by means of a fourth etching process having higher etching selectivity to the initial protective layers than to the word line isolation structures, to form the first filling regions 90 exposing part of the outer peripheral surfaces of the active pillars 40 and part of the outer peripheral surfaces of the word line isolation structures 70, wherein a retained part of the dielectric layers 32 constitute the bit line isolation structures 30, and the retained part of the initial protective layers 51 constitute the protective layers 50. After forming the first filling regions, referring to FIG. 20, the gate oxide layers 100 are formed by means of the deposition process. The gate oxide layers 100 wrap the outer peripheral surfaces of the active pillars 40 exposed in the first filling regions 90. That is, the gate oxide layers 100 wrap the channel regions of the active pillars 40.

Next, the word lines 110 wrapping the gate oxide layers 100 are formed. The word lines 110 extend along the first direction and are configured to connect all the active pillars 40 in the same first direction.

In this embodiment, the openings configured to deposit the word lines 110 are positioned on the sides of the word line isolation structures 70, and the conductive materials configured to form the word lines 110 may be deposited into the first filling regions 90 from the side surfaces of the active pillars, not entering the first filling regions 90 from the top surfaces of the active pillars. Therefore, the conductive materials configured to form the word lines 110 are difficult to fill the gaps 71, thereby not increasing the parasitic capacitance of the semiconductor structure, and improving the performance of the semiconductor structure.

Figure 21:
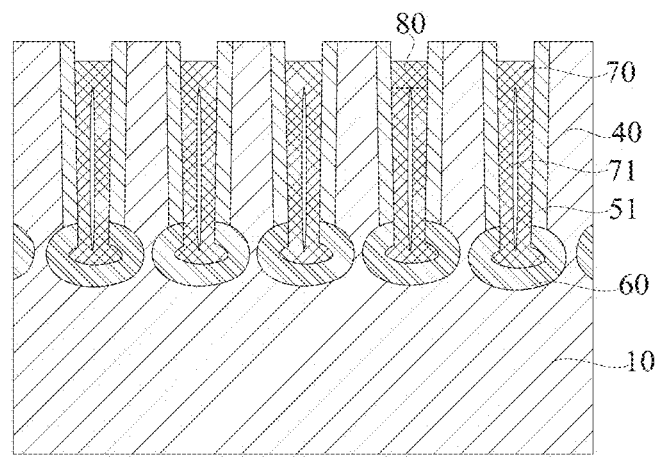
FIG. 21 is a schematic diagram IV of forming the sealing member according to the method for fabricating the semiconductor structure provided in an embodiment of the present disclosure.

In a possible embodiment, referring to FIG. 21, part of the word line isolation structures 70 are removed by means of the second etching process, and the etching speed of the second etching process for the word line isolation structures 70 is higher than the etching speed for the initial protective layers 51. That is, the etching selectivity of the first etching process for the word line isolation structures 70 and the initial protective layers 51 is greater than 2, such that only part of the word line isolation structures 70 are removed under the second etching process, the gaps 71 are not exposed on the top surfaces of the retained part of the word line isolation structures 70, and the sealing members 80 are formed in the regions between the top surfaces of the retained part of the word line isolation structures 70 and the tops of the gaps 71. Taking the orientation shown in FIG. 21 as an example, the sealing members 80 are in the regions of the word line isolation structures 70 between the dashed lines and the tops of the word line isolation structures 70.

Figure 22:
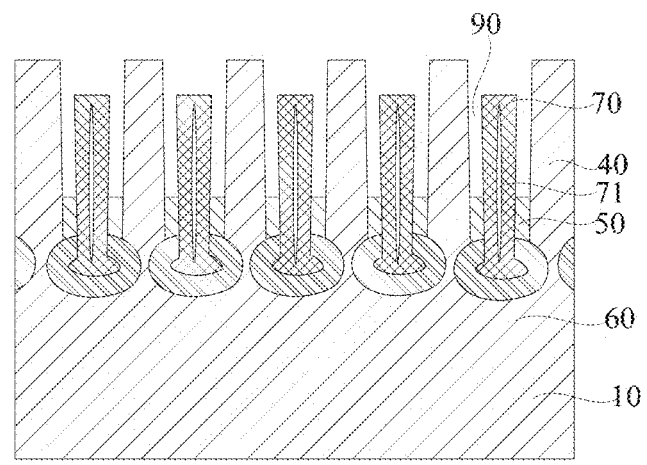
FIG. 22 is a schematic diagram IV of forming the first filling region according to the method for fabricating the semiconductor structure provided in an embodiment of the present disclosure.

Next, referring to FIG. 22, part of the initial protective layers 51 and part of the dielectric layers 32 are removed by means of a wet etching process, and an etching rate of the wet etching process to the initial protective layers 51 and the dielectric layers 32 is higher than an etching rate of the wet etching process to the word line isolation structures 70. Therefore, it is convenient to etch only the initial protective layers 51 and the dielectric layers 32 to form the first filling regions 90 where part of the outer peripheral surfaces of the active pillars 40 and part of the outer peripheral surfaces of the word line isolation structures 70 are exposed. The retained part of the dielectric layers 32 constitute the bit line isolation structures 30, and the retained part of the initial protective layers constitute the protective layers 50.

Figure 23:
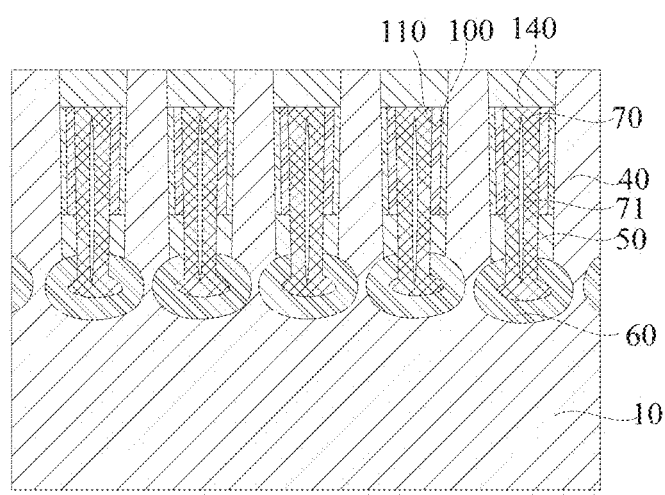
FIG. 23 is a schematic diagram IV of forming the word line according to the method for fabricating the semiconductor structure provided in an embodiment of the present disclosure.

After forming the first filling regions, referring to FIG. 23, the gate oxide layers 100 are formed by means of the deposition process. The gate oxide layers 100 wrap the outer peripheral surfaces of the active pillars 40 exposed in the first filling regions 90. That is, the gate oxide layers 100 wrap the channel regions of the active pillars 40.

Next, the word lines 110 wrapping the gate oxide layers 100 are formed. The word lines 110 extend along the first direction and are configured to connect all the active pillars 40 in the same first direction.

In a possible embodiment, along the second direction, sizes of the initial protective layers 51 are larger than sizes of the word line isolation structures 70. That is, thicknesses of the initial protective layers 51 are larger than thicknesses of the word line isolation structures 70.

Figure 24:
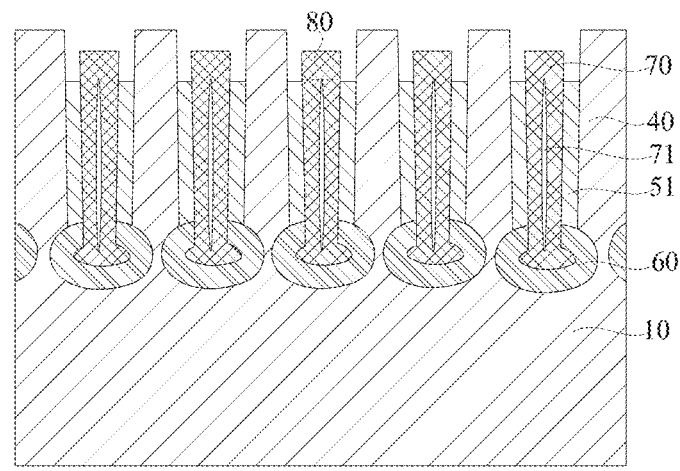
FIG. 24 is a schematic diagram V of forming the sealing member according to the method for fabricating the semiconductor structure provided in an embodiment of the present disclosure.

Referring to FIG. 24, part of the word line isolation structures 70 and part of the initial protective layers 51 are removed by means of the third etching process, and the etching speed of the third etching process for the word line isolation structures 70 is lower than the etching speed for the initial protective layers 51, such that the top surfaces of the retained part of the initial protective layers 51 are lower than the top surfaces of the retained part of the word line isolation structures 70. For example, part of the word line isolation structures 70 and part of the initial protective layers 51 are removed by means of the third etching process having higher etching selectivity to the initial protective layers 51 than to the word line isolation structures 70. In this way, the thicknesses of the word line isolation structures removed are small, and the gaps are not exposed, such that the sealing members 80 are formed in the regions between the top surfaces of the retained part of the word line isolation structures 70 and the tops of the gaps 71.

Figure 25:
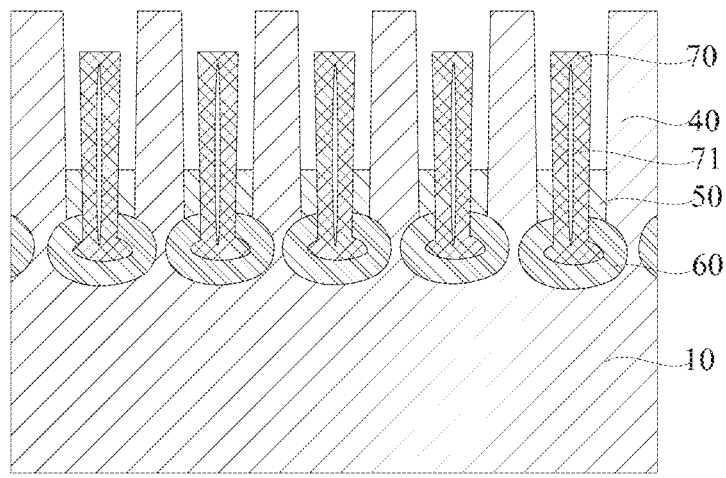
FIG. 25 is a schematic diagram V of forming the first filling region according to the method for fabricating the semiconductor structure provided in an embodiment of the present disclosure.

In this embodiment, the etching time of the third etching process is greater than or equal to 10 s, such that the thicknesses of the initial protective layers removed may be precisely controlled to be between 30 nm and 40 nm, thereby improving the yield of the semiconductor structure. Referring to FIG. 25, part of the initial protective layers 51 and part of the dielectric layers 32 are removed by means of the fourth etching process having higher etching selectivity to the initial protective layers than to the word line isolation structures, and the etching speed of the wet etching process for the initial protective layers 51 and the dielectric layers 32 is higher than that for the word line isolation structures 70. Therefore, it is convenient to etch only the initial protective layers 51 and the dielectric layers 32 to form the first filling regions 90 where part of the outer peripheral surfaces of the active pillars 40 and part of the outer peripheral surfaces of the word line isolation structures 70 are exposed. The retained part of the dielectric layers 32 constitute the bit line isolation structures 30, and the retained part of the initial protective layers 51 constitute the protective layers 50.

In this embodiment, the initial protective layers 51 are etched by 70 nm to 80 nm within the etching time of 2 s to 5 s by means of the fourth etching process, to form the first filling regions 90 where part of the outer peripheral surfaces of the active pillars 40 and part of the outer peripheral surfaces of the word line isolation structures 70 are exposed. It should be noted that the process of removing the initial protective layers by 70 nm to 80 nm may be completed by means of the one-step etching process, or may be completed by means of the two-step etching process.

For the two-step etching process, reference may be made to the two-step etching in the first etching process, which will not be repeated in this embodiment.

Figure 26:
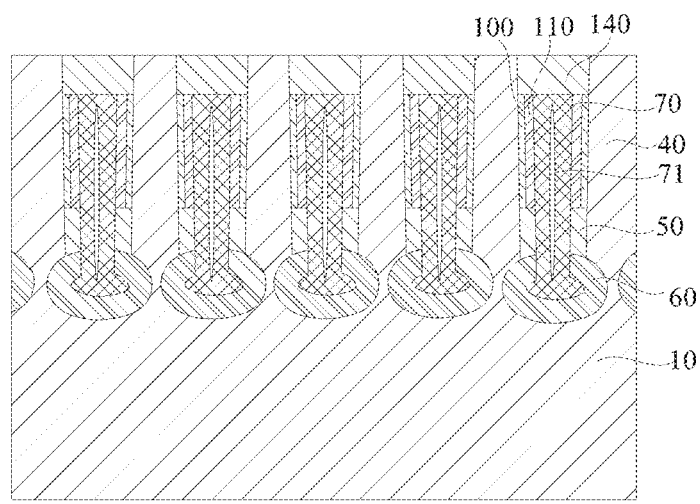
FIG. 26 is a schematic diagram V of forming the word line according to the method for fabricating the semiconductor structure provided in an embodiment of the present disclosure.

Referring to FIG. 26, after forming the first filling regions, the gate oxide layers 100 are formed by means of the deposition process. The gate oxide layers 100 wrap the outer peripheral surfaces of the active pillars 40 exposed in the first filling regions 90. That is, the gate oxide layers 100 wrap the channel regions of the active pillars 40.

Next, the word lines 110 wrapping the gate oxide layers 100 are formed. The word lines 110 extend along the first direction and are configured to connect all the active pillars 40 in the same first direction.

In some embodiments, referring to FIG. 10, FIG. 14, FIG. 20, FIG. 23, and FIG. 26, after the step of forming the word lines extending along the first direction in the first filling regions, the method for fabricating the semiconductor structure further includes:

forming insulating layers 140 covering the gate oxide layers 100 and the word lines 110, the top surfaces of the insulating layers 140 being flush with the substrate 10. The insulating layers 140 are configured to achieve the insulation between other semiconductor devices subsequently formed on the substrate and the word lines 110. Materials of the insulating layers 140 may include silicon nitride, but are not limited thereto.

The embodiments of the present disclosure also provide a semiconductor structure, which is fabricated by the method for fabricating the semiconductor structure in the above-mentioned embodiments. Therefore, the semiconductor structure has the beneficial effects of the above-mentioned embodiments, which are not repeated in this embodiment.

The embodiments or the implementation manners in this specification are described in a progressive manner. Each of the embodiments is focused on difference from other embodiments, and cross reference is available for identical or similar parts among different embodiments.

In the descriptions of this specification, descriptions of reference terms "one embodiment", "some embodiments", "an exemplary embodiment", "an example", "one example", or "some examples" are intended to indicate that features, structures, materials, or characteristics described with reference to the embodiment or example are included in at least one embodiment or example of the present disclosure.

The schematic representation of the above terms throughout this specification does not necessarily refer to the same embodiment or example. Furthermore, the features, structures, materials, or characteristics set forth may be combined in any suitable manner in one or more embodiments or examples.

Finally, it should be noted that the foregoing embodiments are merely intended for describing the technical solutions of the present disclosure, but not for limiting the present disclosure. Although the present disclosure is described in detail with reference to the foregoing embodiments, persons of ordinary skill in the art should understand that they may still make modifications to the technical solutions described in the foregoing embodiments or make equivalent replacements to some or all technical features thereof, which does not make corresponding technical solutions in essence depart from the scope of the technical solutions of the embodiments of the present disclosure.

What is claimed is:

1. A method for fabricating a semiconductor structure, comprising:

providing a substrate, word line trenches extending along a first direction and bit line trenches extending along a second direction being provided in the substrate, the word line trenches and the bit line trenches separating the substrate into a plurality of active pillars arranged at intervals, and along the first direction, a dielectric layer being provided between adjacent two of the plurality of active pillars; wherein the first direction intersects with the second direction;

forming initial protective layers on side walls of the word line trenches, the substrate being exposed in a region surrounded by the initial protective layers;

forming word line isolation structures in the region surrounded by the initial protective layers, the word line isolation structures having gaps therein;

forming sealing members configured to seal up at least tops of the gaps;

forming first filling regions, the first filling regions being exposed on outer peripheral surfaces of the plurality of active pillars and outer peripheral surfaces of the word line isolation structures; and forming word lines extending along the first direction in the first filling regions, the word lines being connected to all of the plurality of active pillars positioned in the same first direction.

2. The method for fabricating the semiconductor structure according to claim 1, wherein each of the sealing members comprises a plurality of sealing strips, each of the plurality of sealing strips being projected on the substrate to cover all of the plurality of active pillars positioned in the same second direction, or to cover at least the word line isolation structures.

3. The method for fabricating the semiconductor structure according to claim 2, wherein the forming the sealing members configured to seal up at least the tops of the gaps comprises:

forming sealing layers on the substrate, the sealing layers further covering the initial protective layers and the word line isolation structures; and removing part of the sealing layers, a retained part of the sealing layers forming a plurality of first sealing strips spaced along the first direction, each of the plurality of first sealing strips extending along the second direction, and a projection of each of the plurality of first sealing strips on the substrate covering all of the plurality of active pillars positioned in the same second direction; wherein the plurality of first sealing strips constitute the sealing members.

4. The method for fabricating the semiconductor structure according to claim 2, wherein the forming the sealing members configured to seal up at least the tops of the gaps comprises:

removing the word line isolation structures by part of a thickness, a retained part of the word line isolation structures and the initial protective layers defining second filling regions, and the gaps being not exposed in the second filling regions; and forming a plurality of second sealing strips in each of the second filling regions, the plurality of second sealing strips constituting the sealing members.

5. The method for fabricating the semiconductor structure according to claim 2, wherein the forming the sealing members configured to seal up at least the tops of the gaps comprises:

removing the initial protective layers by at least part of a thickness by means of a first etching process to form etching holes extending along the first direction; and forming third sealing strips in the etching holes, top surface of the third sealing strips being flush with top surfaces of the word line isolation structures, and the third sealing strips and tops of the word line isolation structures constituting the sealing members.

6. The method for fabricating the semiconductor structure according to claim 5, wherein etching selectivity of the first etching process to the initial protective layers and the word line isolation structures is greater than 2, and first etching time of the first etching process ranges from 2 s to 5 s.

7. The method for fabricating the semiconductor structure according to claim 1, wherein the forming the sealing members configured to seal up at least the tops of the gaps comprises:

removing part of the word line isolation structures, the gaps being not exposed on the top surfaces of the retained part of the word line isolation structures, such that the sealing members are formed in regions between the top surfaces of the retained part of the word line isolation structures and the tops of the gaps.

8. The method for fabricating the semiconductor structure according to claim 7, wherein the removing part of the word line isolation structures comprises:

removing part of the word line isolation structures by means of a second etching process, an etching speed of the second etching process to the word line isolation structures being greater than an etching speed of the second etching process to the initial protective layers.

9. The method for fabricating the semiconductor structure according to claim 8, wherein etching selectivity of the second etching process to the word line isolation structures and the initial protective layers is greater than 2.

10. The method for fabricating the semiconductor structure according to claim 6, wherein along the second direction, sizes of the initial protective layers are larger than sizes of the word line isolation structures; and the removing part of the word line isolation structures comprises:

removing part of the word line isolation structures and part of the initial protective layers by means of a third etching process, an etching speed of the third etching process to the word line isolation structures is smaller than an etching speed of the third etching process to the initial protective layers, such that top surfaces of the retained part of the initial protective layers are lower than the top surfaces of the retained part of the word line isolation structures.

11. The method for fabricating the semiconductor structure according to claim 10, wherein etching time of the third etching process is greater than or equal to 10 s.

12. The method for fabricating the semiconductor structure according to claim 1, wherein the forming the first filling regions comprises:

removing part of the initial protective layers and part of the dielectric layers by means of a fourth etching process having higher etching selectivity to the initial protective layers than to the word line isolation structures, to form the first filling regions exposing part of the outer peripheral surfaces of the plurality of active pillars and part of the outer peripheral surfaces of the word line isolation structures, wherein a retained part of the dielectric layers constitute bit line isolation structures, and the retained part of the initial protective layers constitute protective layers.

13. The method for fabricating the semiconductor structure according to claim 12, wherein after forming the first filling regions, and before forming the word lines extending along the first direction in the first filling regions, the method further comprises:

forming gate oxide layers, the gate oxide layers wrapping the outer peripheral surfaces of the plurality of active pillars exposed in the first filling regions.

14. The method for fabricating the semiconductor structure according to claim 13, wherein after forming the word lines extending along the first direction in the first filling regions, the method further comprises:

forming insulating layers covering the gate oxide layers and the word lines, top surfaces of the insulating layers being flush with the substrate.

15. A semiconductor structure, wherein the semiconductor structure is fabricated by means of the method for fabricating the semiconductor structure according to claim 1.

* * * * *